(12) United States Patent
Takagi et al.

(10) Patent No.: US 7,453,116 B2
(45) Date of Patent: Nov. 18, 2008

(54) SEMICONDUCTOR MEMORY DEVICE AND METHOD OF FABRICATING THE SAME

(75) Inventors: Hideo Takagi, Aizuwakamatsu (JP);
Takayuki Enda, Aizuwakamatsu (JP);
Miyuki Umetsu, Aizuwakamatsu (JP);
Tsukasa Takamatsu, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 260 days.

(21) Appl. No.: 11/368,678

(22) Filed: Mar. 7, 2006

(65) Prior Publication Data

US 2006/0145242 A1    Jul. 6, 2006

Related U.S. Application Data

(62) Division of application No. 10/714,909, filed on Nov. 18, 2003, now Pat. No. 7,037,780.

(30) Foreign Application Priority Data

Dec. 6, 2002    (JP) ............................. 2002-355933

(51) Int. Cl.
*H01L 29/76* (2006.01)

(52) U.S. Cl. .................. 257/314; 257/295; 257/311; 438/257; 438/260

(58) Field of Classification Search ............ 257/295, 257/304, 311, 314, 758; 438/257, 260, 288, 438/303
See application file for complete search history.

(56) References Cited

U.S. PATENT DOCUMENTS

| 4,264,376 | A | 4/1981 | Yatsuda et al. |
| 6,103,572 | A | 8/2000 | Kirihara |
| 6,713,388 | B2 * | 3/2004 | Tseng et al. ............... 438/673 |
| 6,794,694 | B2 * | 9/2004 | Diodato et al. ............ 257/295 |

FOREIGN PATENT DOCUMENTS

| JP | 55-30846 A | 3/1980 |
| JP | 61-154174 A | 7/1986 |
| JP | 61-288471 A | 12/1986 |
| JP | 61-290771 A | 12/1986 |
| JP | 10-284627 A | 10/1998 |
| JP | 11-163072 A | 6/1999 |
| JP | 2000-174126 A | 6/2000 |
| WO | WO 94/10686 | 5/1994 |

OTHER PUBLICATIONS

Office Action dated Jun. 17, 2008 issued in corresponding Japanese Application No. 2002-355933.

* cited by examiner

*Primary Examiner*—Phuc T Dang
(74) *Attorney, Agent, or Firm*—Westerman, Hattori, Daniels & Adrian, LLP.

(57) ABSTRACT

A silicon nitride film for storing electric charge is formed on a semiconductor substrate while placing a tunnel oxide film in between, and the silicon nitride film is then subjected to hydrogen plasma treatment so as to effectively erase unnecessary charge stored therein during various process steps in fabrication of the semiconductor memory device, to thereby stabilize the threshold voltage ($V_{th}$) of the semiconductor memory device.

2 Claims, 7 Drawing Sheets

(CORE AREA)    (PERIPHERAL CIRCUIT AREA)

(CORE AREA)    (PERIPHERAL CIRCUIT AREA)

(CORE AREA)    (PERIPHERAL CIRCUIT AREA)

SEMICONDUCTOR MEMORY DEVICE AND METHOD OF FABRICATING THE SAME

CROSS-REFERENCE TO RELATED APPLICATIONS

This application is a divisional of application Ser. No. 10/714,909, filed Nov. 18, 2003.

BACKGROUND OF THE INVENTION

1. Field of the Invention

The present invention relates to a semiconductor memory device and a method for fabricating the same, and in particular such that being preferably applicable to those having a charge storage film for storing electric charge.

2. Description of the Related Art

Any semiconductor memory device storing data by storing electric charge has a charge storage film for storing the charge, and writes or erases data by varying threshold voltage ($V_{th}$) of the memory cell transistor depending on the amount of charge stored in the charge storage film.

The aforementioned writing or erasure of data in, for example, a SONOS (semiconductor/oxide film/nitride film/oxide film/semiconductor)-type semiconductor memory device is effected by generating a potential difference between a gate electrode (word line) of a selected memory cell and a semiconductor substrate (bit line), and then by injecting hot electrons into the charge storage film, or by injecting holes based on band-to-band tunneling.

Conventional fabrication of the semiconductor memory device has, however, been suffering from a problem that the charge storage film was likely to store unnecessary charge during various process steps in the fabrication. This resulted in generation of error or variation of charge to be stored in the charge storage film when the semiconductor memory device is operated for writing or erasure, which undesirably varied the threshold voltage and prevented the device from being stably operated.

The present invention is accomplished considering the aforementioned problem, and is to provide a semiconductor memory device and a method of fabricating the device, both of which being aimed at avoiding storing of unnecessary charge into the charge storage film, and thus stabilizing the threshold voltage.

SUMMARY OF THE INVENTION

The present inventors reached the following aspects of the present invention after extensive investigations.

One aspect of the present invention relates to a method of fabricating a semiconductor memory device which comprises the steps of forming a charge storage film for storing electric charge; and erasing electric charge stored in the charge storage film by subjecting the charge storage film to hydrogen plasma treatment after the formation thereof.

Another aspect of the present invention relates to a method of fabricating a semiconductor memory device which comprises the steps of forming a charge storage film for storing electric charge; and erasing electric charge stored in the charge storage film by subjecting the charge storage film to hydrogen annealing after the formation thereof.

Still another aspect of the present invention relates to a semiconductor memory device such that having a charge storage film for storing electric charge, and having, in addition to a first contact hole used for wiring connection, a second contact hole not used for wiring connection but used for facilitating diffusion of hydrogen radicals or hydrogen molecules into said charge storage film.

DETAILED DESCRIPTION OF THE PREFERRED EMBODIMENTS

Basic Concept of the Present Invention

Figure 1A:
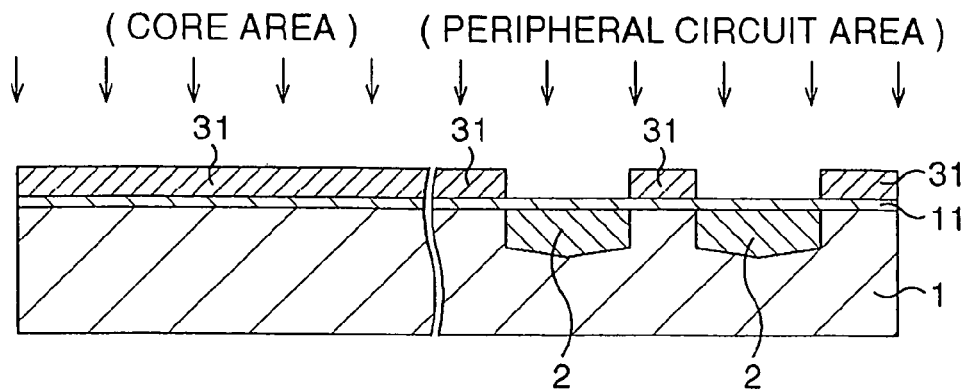
FIGS. 1A through 1D are schematic sectional views sequentially showing process steps of a method of fabricating a SONOS-type semiconductor memory device according to an embodiment of the present invention.

In the field of fabricating semiconductor memory devices, hydrogen plasma treatment is typically carried out after contact holes for establishing wiring contact are formed, in order to remove foreign matters such as carbon contained in a barrier layer, which are derived from TDMAT (Tetrakis dimethylamino titanium) used as a source gas for forming the barrier layer by the CVD process. Removal of such foreign matters can be accomplished by hydrogen plasma treatment within 35 seconds or around.

On the other hand, conventional fabrication of the semiconductor memory device has been suffering from a problem that, once the charge storage film for storing electric charge was formed, the film was likely to store unnecessary charge during various process steps thereafter in the fabrication, which resulted in error or variation in the threshold voltage. The storing of unnecessary charge into the charge storage film is, however, unavoidable in the fabrication process, and thus only possible way was to erase the unnecessary charge already being stored into the film. After thorough considerations for addressing the problem, the present inventors reached the present invention described below.

The present invention is designed so as to form the charge storage film, subject the charge storage film to hydrogen plasma treatment for a predetermined duration of time, to thereby allow hydrogen radicals to diffuse into the film, with which the stored unnecessary charge (negative charge) is cancelled. Carrying-out of the hydrogen plasma treatment after the contact holes are formed will be advantageous since the unnecessary charge in the charge storage film can be removed without causing any increase in the number of process steps.

The hydrogen plasma treatment for removing the unnecessary charge in the charge storage film is by no means achievable by the aforementioned short-term hydrogen plasma treatment for removing impurities such as carbon, due to special feature of the process whereby the stored unnecessary charge in the charge storage film must be erased. Our experimental results on the threshold voltage characteristics, which will be described later, revealed that the purpose of erasing the unnecessary charge in the charge storage film would never be achieved unless the hydrogen plasma treatment would be continued at least for 40 seconds, for the case where the erasure was to be effected through a titanium nitride film (CVD-TIN film) of 5 nm thick. We have, on the other hand, reached a conclusion that it was appropriate to finish the treatment within 90 seconds from the viewpoint of throughput in fabrication of the semiconductor memory device. Based on the discussion in the above, we concluded that a duration of time of 40 to 90 seconds was optimum for the hydrogen plasma treatment while taking both goals into account, that are, erasure of the unnecessary charge stored in the charge storage film, and assurance of a practical throughput in the fabrication process.

As for a process in which the unnecessary charge stored in the charge storage film is erased by hydrogen annealing in place of hydrogen plasma treatment, we concluded that an optimum duration of time is 30 to 90 minutes while taking both goals into account, that are, erasure of the unnecessary charge stored in the charge storage film, and assurance of a practical throughput in the fabrication process.

As described in the above, the present invention is to provide a method capable of preventing the charge storage film from being stored with unnecessary charge, and of thus stabilizing the threshold voltage without causing any increase in the number of process steps in the fabrication, by making use of hydrogen plasma treatment (or hydrogen annealing) under well-adjusted conditions.

Specific Embodiments Applied with the Present Invention

Next, specific embodiments of the present invention will be described referring to the attached drawings, which is an adaptation of the above-described basic concepts on the semiconductor memory device and the method of fabricating the same. In the present embodiment, a buried-bit-line-type SONOS semiconductor memory device is disclosed as one example of the semiconductor memory device. Design of the semiconductor memory device employs planar-type SONOS transistors in the memory cell area (core area), and CMOS transistors in the peripheral circuit area.

FIGS. 1A to 6B are schematic views sequentially showing process steps of a method of fabricating a semiconductor memory device containing the buried-bit-line-type SONOS transistors of the present embodiment. In FIGS. 1A to 3C, the left halves show sectional views of the core area taken in parallel to a gate electrode (a word line), and right halves show those of the peripheral circuit area.

First, as shown in FIG. 1A, a semiconductor substrate 1 comprising a p-type silicon (Si) is thermally oxidized to thereby form a silicon oxide ($SiO_2$) film 11 of approx. 20 nm thick. A resist pattern 31 is formed by photolithography so as to expose an area for forming transistors in the peripheral circuit area, phosphorus (P) ion is implanted over the entire surface, and the impurity is thermally diffused by annealing to thereby form an N-well 2. The resist pattern 31 is then removed typically by ashing using $O_2$ plasma.

Figure 1B:
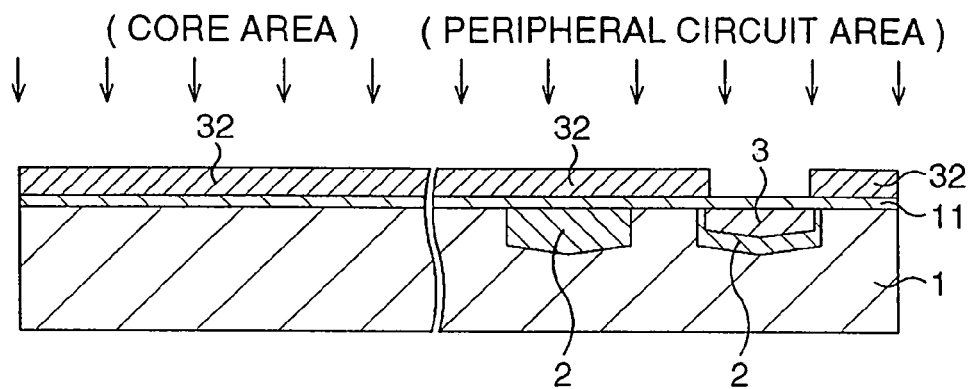

Next, as shown in FIG. 1B, a resist pattern 32 is formed by photolithography so as to expose an area for forming an NMOS transistor in the peripheral circuit area, boron (B) ion is implanted over the entire surface, and the impurity is thermally diffused by annealing to thereby form a P-well 3, where a triple-well structure is obtained in the NMOS transistor formable area. The resist pattern 32 is then removed typically by ashing using $O_2$ plasma.

Figure 1C:
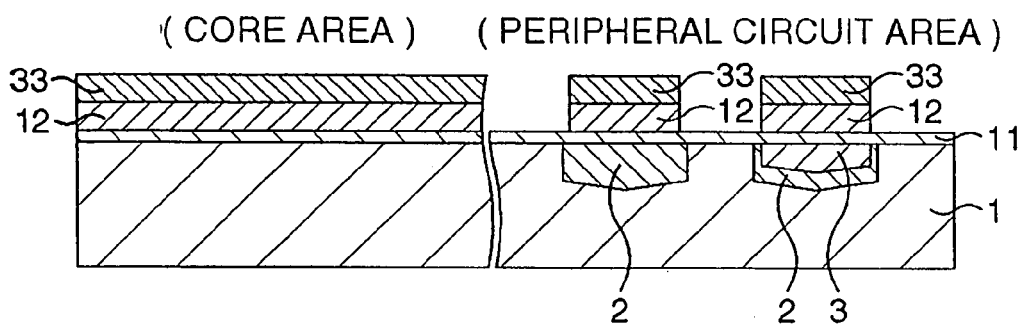

Next, a silicon nitride film 12 of approx. 100 nm thick is deposited on the silicon oxide film 11 by the CVD process. A resist pattern 33 is then formed by photolithography so as to be opened corresponding to areas where element isolation regions are to be formed, and the silicon nitride film 12 is dry-etched so as to be opened corresponding to areas where element isolation regions are to be formed, as shown in FIG. 1C. The resist pattern 33 is then removed typically by ashing using $O_2$ plasma.

Figure 1D:
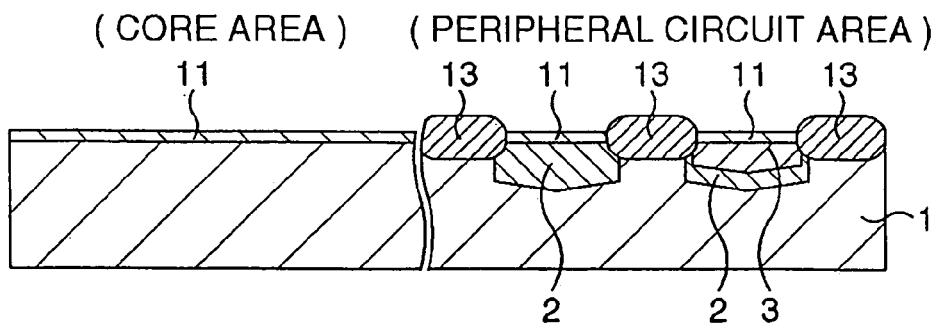

Next, as shown in FIG. 1D, a thick silicon oxide film 13 is formed by so-called LOCOS process only in the areas not covered with the silicon nitride film 12, to thereby partition the element active region. The silicon nitride film 12 is then removed by dry etching.

Figure 2A:
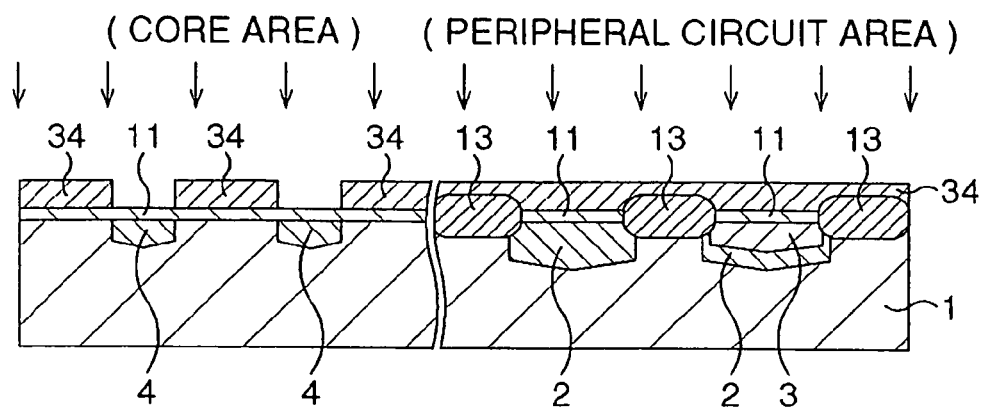
FIGS. 2A through 2D are schematic sectional views sequentially showing process steps as continued from FIG. 1D.

Next, as shown in FIG. 2A, a resist pattern 34 having a bit-line pattern is formed by photolithography, arsenic (As) ion is implanted over the entire surface under masking by the resist pattern 34, and the impurity is thermally diffused by annealing to thereby form a bit-line, impurity-diffused layer 4 which is used in common with source-and-drain region, in the core area. The resist pattern 34 is then removed typically by ashing using $O_2$ plasma.

Figure 2B:
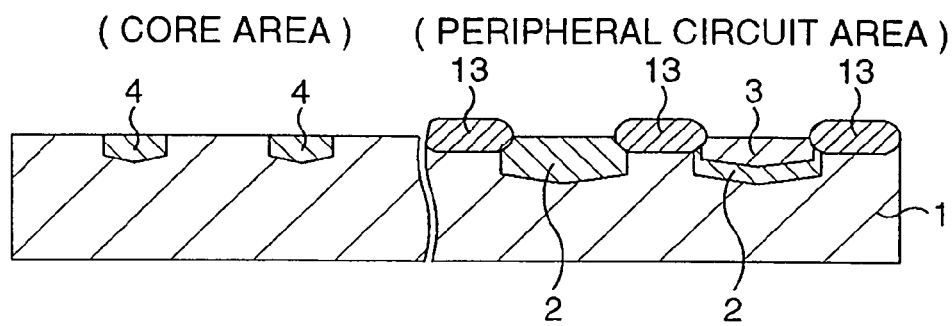

Next, as shown in FIG. 2B, the silicon oxide film 11 is removed by wet etching using hydrofluoric acid (HF), to thereby expose the surface of the semiconductor substrate 1 in the core area and the element active regions in the peripheral circuit area.

Figure 2C:
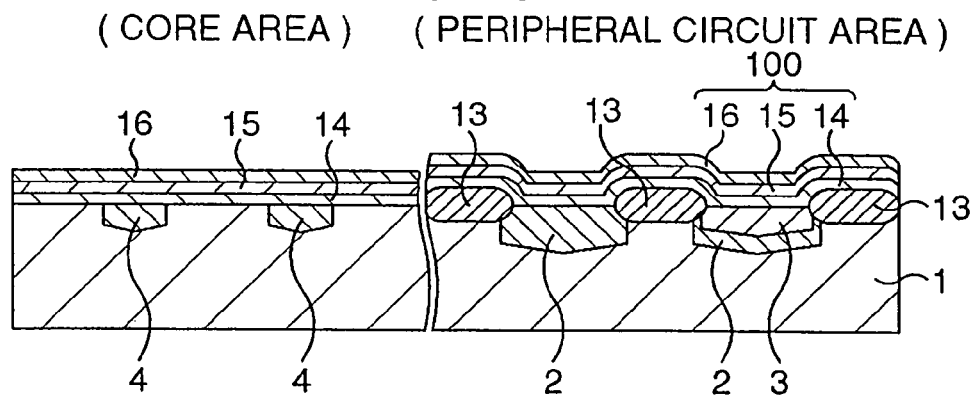

Next, as shown FIG. 2C, a tunnel oxide film (silicon oxide film) 14 of approx. 7 nm thick is formed by thermal oxidation, a silicon nitride film 15 of approx. 10 nm thick is formed on the tunnel oxide film 14 by the CVD process, and a silicon oxide film 16 of approx. 7 nm thick is formed on the silicon nitride film 15 by the CVD process. This completes an ONO film 100 which comprises three films of the tunnel oxide film 14, silicon nitride film 15, and silicon oxide film 16. The silicon nitride film 15 herein functions as a charge storage film for storing electric charge in the semiconductor memory device.

Figure 2D:
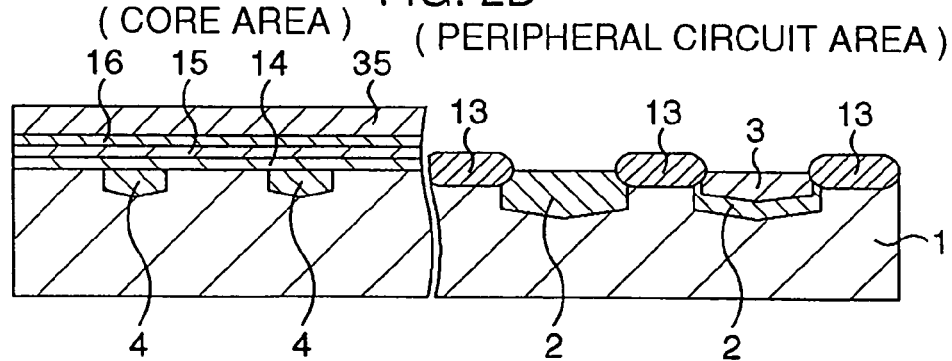

Next, as shown in FIG. 2D, a resist pattern 35 is formed by photolithography so as to expose the peripheral circuit area, and the ONO film 100 in the peripheral circuit area is removed by dry etching. The resist pattern 35 is then removed typically by ashing using $O_2$ plasma.

Figure 3A:
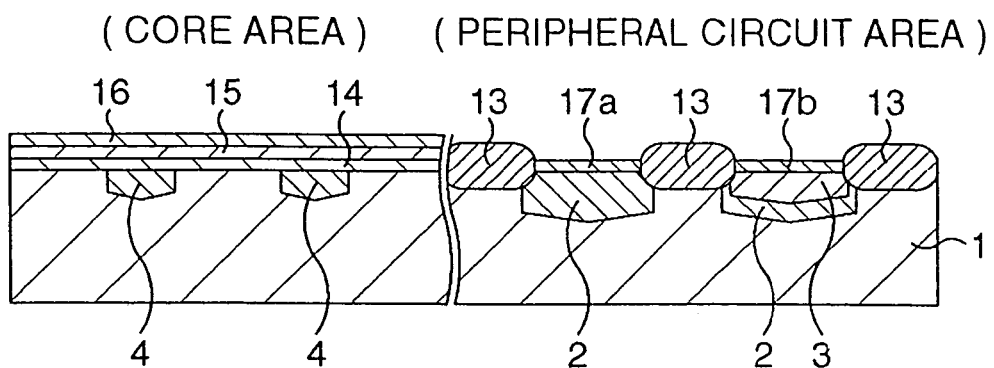
FIGS. 3A through 3C are schematic sectional views sequentially showing process steps as continued from FIG. 2D.

Next, the surface of the semiconductor substrate 1 is heated at a temperature as high as 1,000° C. so as to form a silicon oxide film ($SiO_2$ film) of approx. 8 nm thick, as shown in FIG. 3A. An unshown resist pattern is then formed so as to be opened in the area for forming a PMOS transistor in the peripheral circuit area, and the silicon oxide film in the PMOS transistor formable area is removed by wet etching using hydrofluoric acid (HF). The unshown resist pattern is then removed typically by ashing using $O_2$ plasma, and the surface of the semiconductor substrate 1 is again heated at a temperature as high as 1,000° C. so as to form a silicon oxide film ($SiO_2$ film) of approx. 10 nm thick, to thereby form two different gate insulating films, that are, a gate insulating film 17a of approx. 10 nm thick in the PMOS transistor formable area and a gate insulating film 17b of approx. 13 nm thick in the NMOS transistor formable area.

Figure 3B:
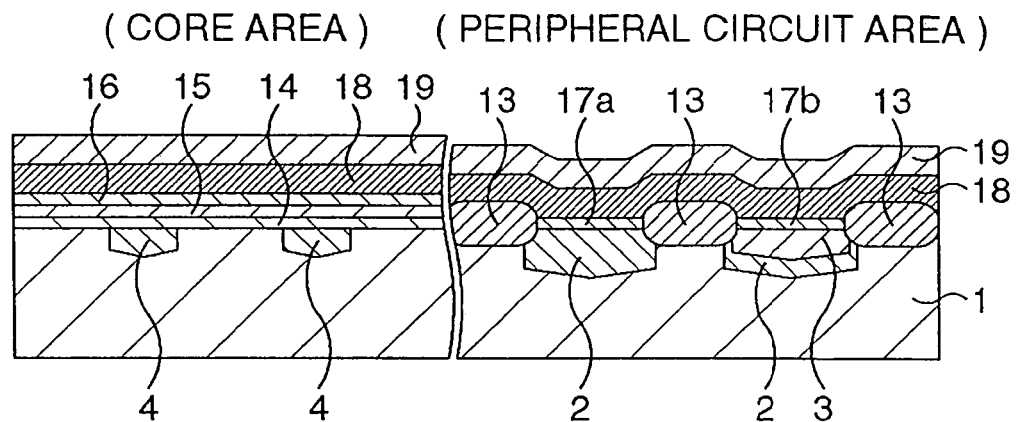

Next, as shown in FIG. 3B, a polysilicon film 18 of approx. 100 nm thick is deposited by the CVD process in the core area and peripheral circuit area. Further on the polysilicon film 18, a tungsten silicide film 19 of approx. 150 nm thick is formed by the CVD process.

Figure 3C:
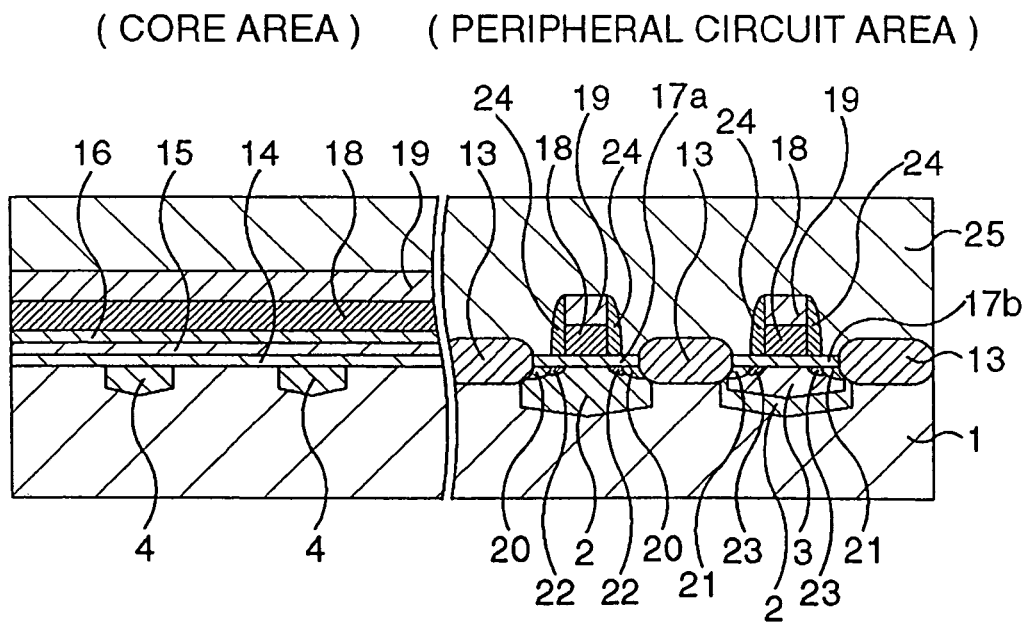

Next, as shown in FIG. 3C, the tungsten silicide film 19 and polysilicon film 18 are patterned by photolithography and succeeding dry etching, to thereby form gate electrodes comprising the tungsten silicide film 19 and polysilicon film 18 respectively in the core area, and in the PMOS transistor formable area and NMOS transistor formable area of the peripheral circuit area. The gate electrode herein in the core area is formed so as to cross with the bit-line, impurity-diffused layer 4 nearly at right angles.

LDD-structured source-and-drain regions 20, 21 are then formed only in the peripheral circuit area.

More specifically, in the PMOS formable area, a p-type impurity ion is implanted into the surficial area of the semiconductor substrate 1 on both sides of the gate electrode, to thereby form an extension regions 22. On the other hand, in the NMOS formable area, an n-type impurity ion is implanted into the surficial area of the semiconductor substrate 1 on both sides of the gate electrode, to thereby form extension regions 23.

Next, a silicon oxide film is deposited by the CVD process over the entire surface, and is then anisotropically etched (etch-back) from the top surface thereof so as to allow the silicon oxide film to remain only on both side faces of the gate electrodes, to thereby form sidewalls 24.

Next, in the PMOS transistor formable area, a p-type impurity ion is implanted into the surficial portion of the semiconductor substrate 1 on both sides of the gate electrode and sidewalls 24, to thereby form deep source-and-drain regions 20 which partially overlap the extension regions 22. On the other hand, in the NMOS transistor formable area, an n-type impurity ion is implanted into the surficial portion of the semiconductor substrate 1 on both sides of the gate electrode and sidewalls 24, to thereby form deep source-and-drain regions 21 which partially overlap the extension regions 23.

Figure 4A:
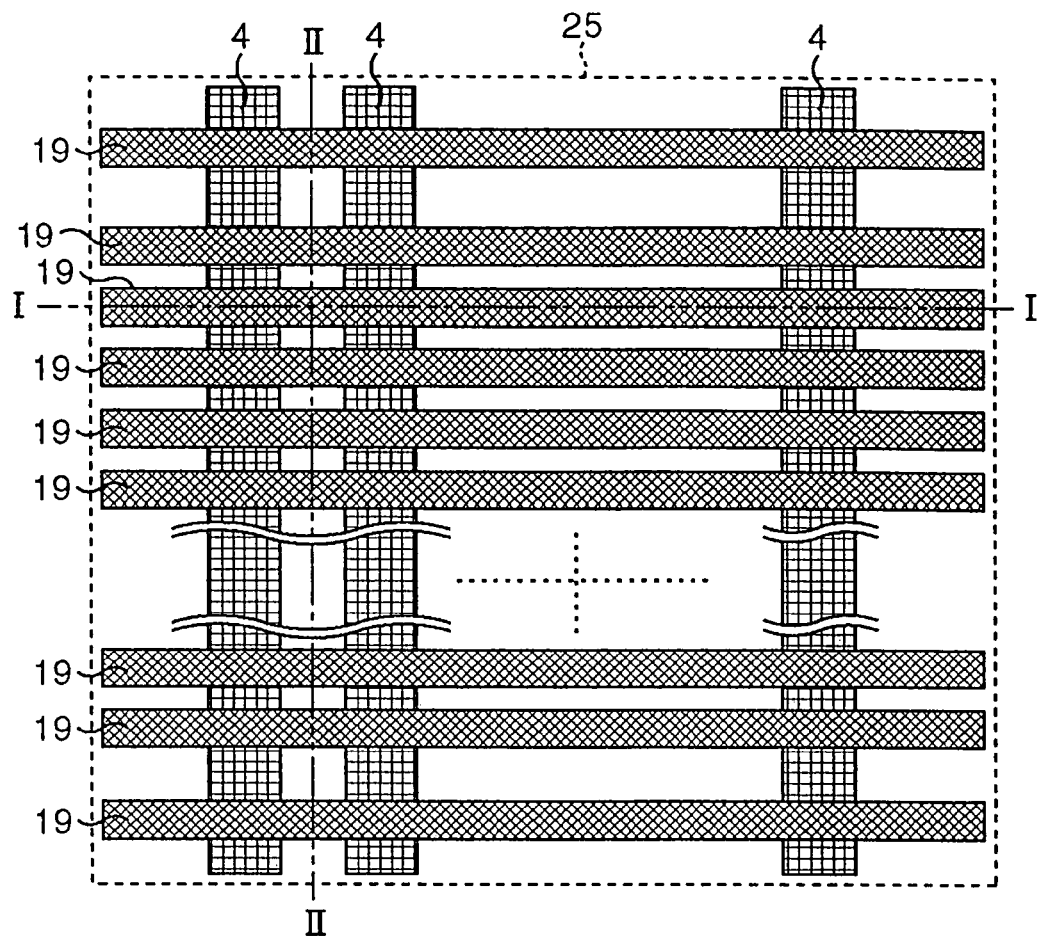
FIGS. 4A and 4B are schematic views of a core portion of the SONOS-type semiconductor memory device, previously shown in FIG. 3C, according to an embodiment of the present invention.
Figure 4B:
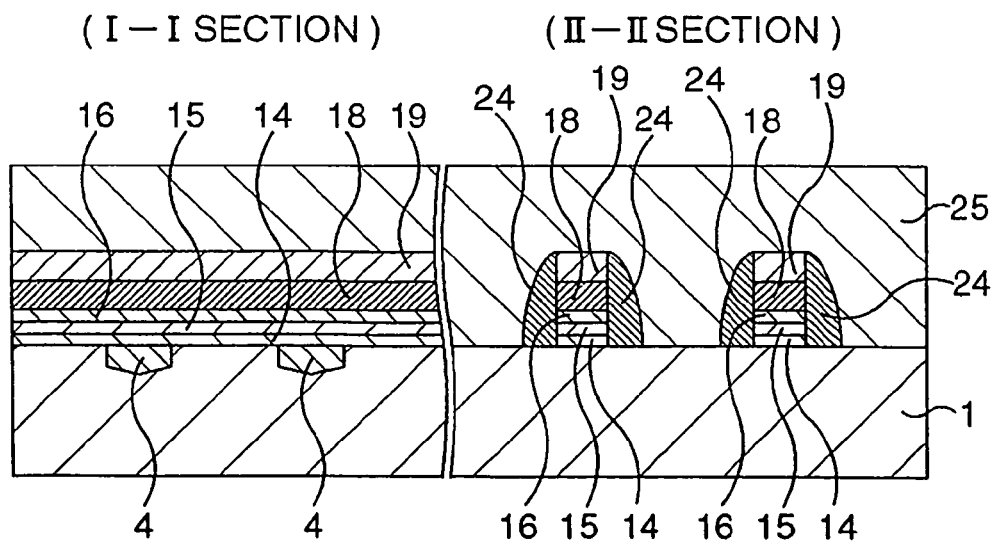

Thereafter, an insulating film 25, which comprises a BPSG film or a silicon oxide film formed in a high density plasma, is deposited by the CVD process over the entire surface, and then planarized by the CMP (chemical-mechanical polishing) process. A schematic plan view of the core area is shown in FIG. 4A, and a schematic sectional view taken along line I-I and line II-II in FIG. 4A is shown in FIG. 4B.

Figure 5A:
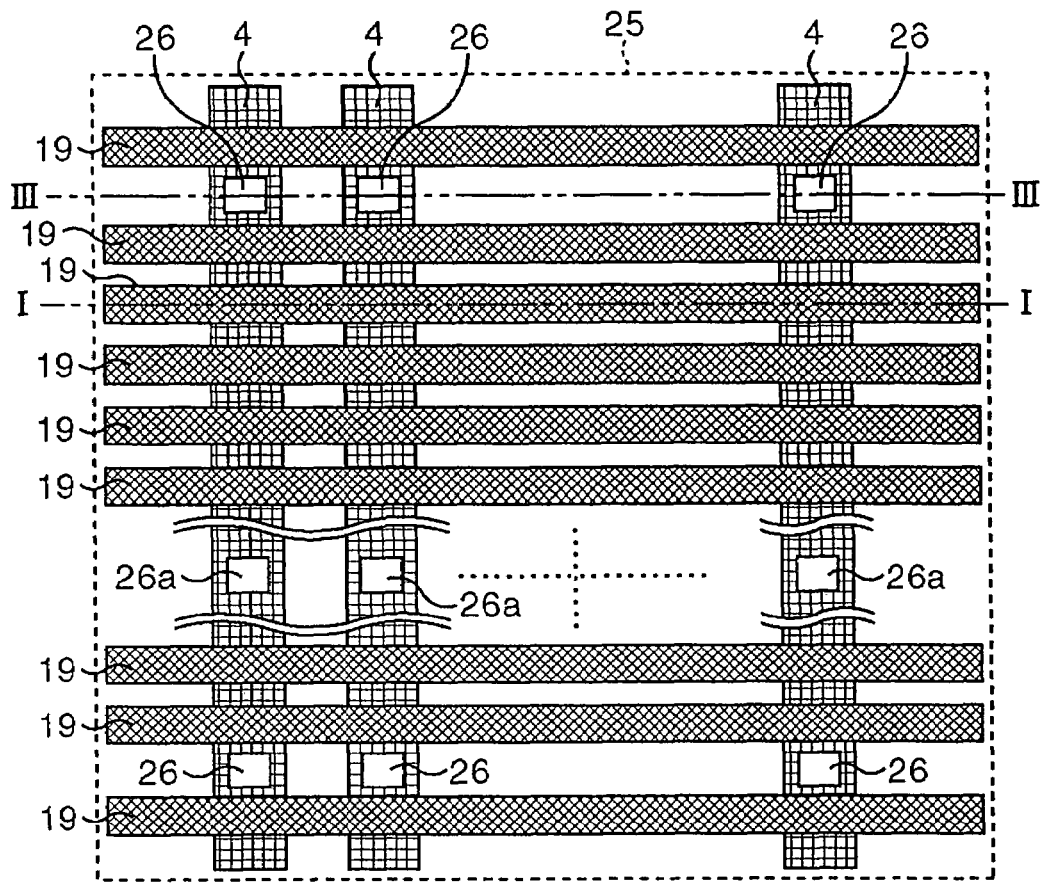
FIGS. 5A and 5B are schematic views of the core portion of the SONOS-type semiconductor memory device obtained by the method of fabricating the SONOS-type semiconductor memory device in the embodiment of the present invention, as continued from FIGS. 4A and 4B.
Figure 5B:
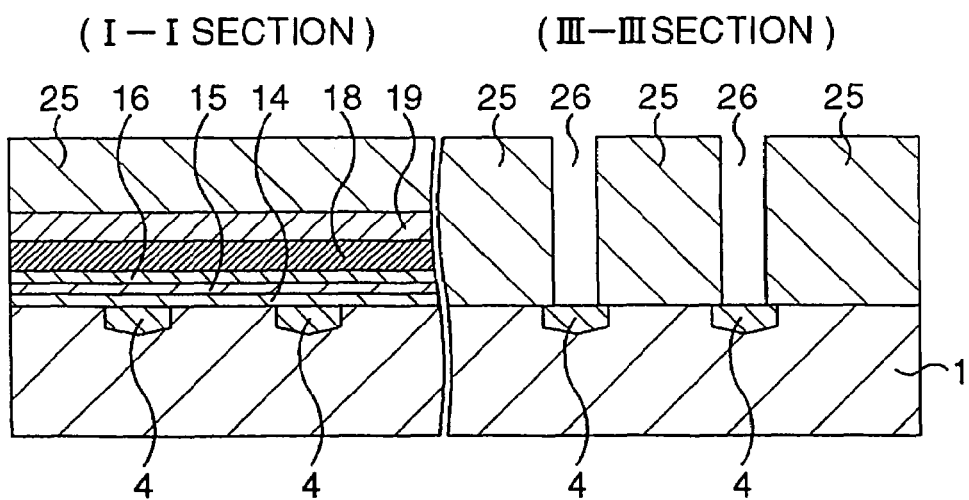

Next, as shown in FIGS. 5A and 5B, contact holes 26 through which electrodes are drawn out are formed in the insulating film 25 by photolithography and succeeding dry etching. A schematic plan view of the core area is shown in FIG. 5A, and a schematic sectional view taken along line I-I and line III-III in FIG. 5A is shown in FIG. 5B. As shown in FIG. 5A, in the present embodiment, the contact holes 26 used for wiring connection are formed for every sixteen word lines 19 so as to reach the bit-line, impurity-diffused layers 4 at predetermined positions. There are also formed dummy contact holes 26a, which substantially do not contribute to wiring connection, so as to reach the bit-line, impurity-diffused layers 4.

Figure 6A:
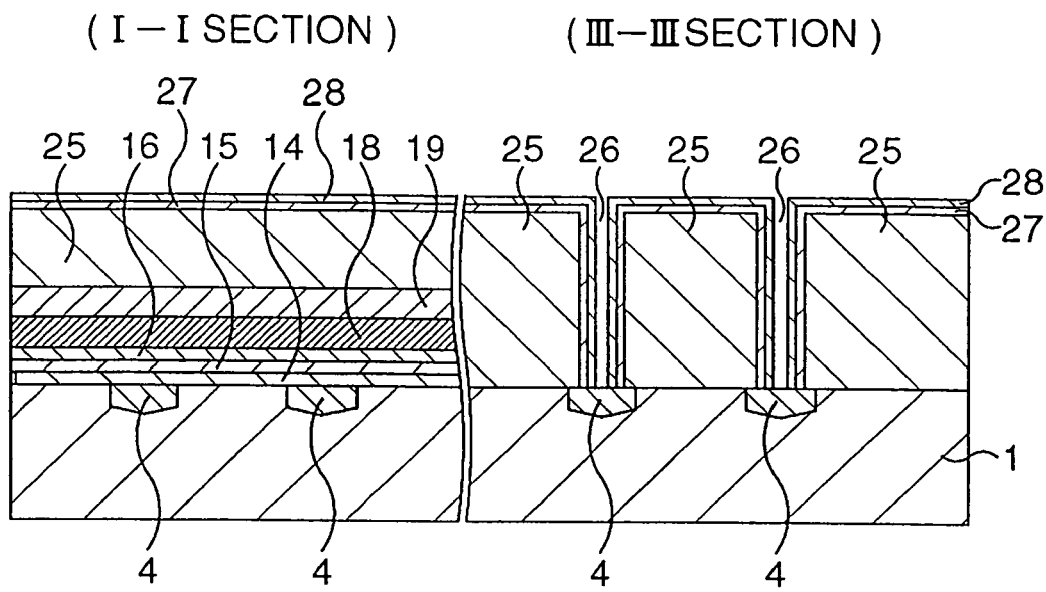
FIGS. 6A and 6B are schematic sectional views sequentially showing process steps of the method of fabricating the SONOS-type semiconductor memory device according to the embodiment of the present invention, as continued from FIGS. 5A and 5B.

Next, the surface of the semiconductor substrate 1 is cleaned by using a cleaning solution containing hydrofluoric acid (HF) (hydrofluoric acid pre-treatment) or by using plasma (plasma pre-treatment), and as shown in FIG. 6A, a titanium (Ti) film 27, where Ti is a refractory metal, of approx. 5 to 80 nm thick is formed by the IMP (Ionized Metal Plasma) process. On the titanium film 27, a titanium nitride film 28 of approx. 5 to 50 nm thick is further formed by the CVD process using TDMAT as a source gas. FIG. 6A shows a sectional view taken along the line I-I and line III-III in the core area shown in FIG. 5A.

In the present embodiment, the titanium nitride film 28 is formed typically in a thickness of 5 nm by the CVD process, and is then subjected to hydrogen plasma treatment at 350° C. to 450° C. for 40 seconds to 90 seconds. The titanium nitride film 28 herein is formed at a film forming temperature of 350° C. to 450° C. or around. It is also allowable to repeat, a plural number of times, the process steps of forming the titanium nitride film 28 in a thickness of 5 nm, and of subjecting the film to hydrogen plasma treatment for 70 seconds. Exemplary conditions for the hydrogen plasma treatment include hydrogen ($H_2$) flow rate of 300 SCCM, nitrogen ($N_2$) flow rate of 200 SCCM, RF power of 750 W, and RF frequency of 350 kHz. Such hydrogen plasma treatment is successful in erasing unnecessary charge in the silicon nitride film 15 stored therein during the fabrication process. Raising the RF power to 850 W, for example, can raise the density of hydrogen radical and can successfully enhance effect of the erasure. In addition, if the hydrogen plasma treatment is carried out before the titanium nitride film 28 is formed, hydrogen radical can more effectively be diffused through the contact holes without being consumed in formation of methylamine ($HNCH_3$) or its analogue which otherwise possibly generates as a byproduct of titanium nitride when TDMAT is used as a source gas. Hydrogen plasma treatment before formation of the titanium nitride film 27 is also advantageous in allowing hydrogen to effectively diffuse through the contact holes without being gettered by titanium.

For the case where the titanium nitride 28 is formed by the CVD process using TDMAT as a source gas, succeeding hydrogen plasma treatment for as long as 35 seconds or more can beneficially remove impurities such as carbon derived from TDMAT.

It is also allowable to carry out the aforementioned hydrogen plasma treatment typically by the double-frequency process which is based on so-called ICP (induction-coupled plasma) process. The same effect can be obtained by hydrogen annealing, employed in place of hydrogen plasma treatment, at 400° C. to 450° C. or around for 30 minutes to 90 minutes or around.

Figure 6B:
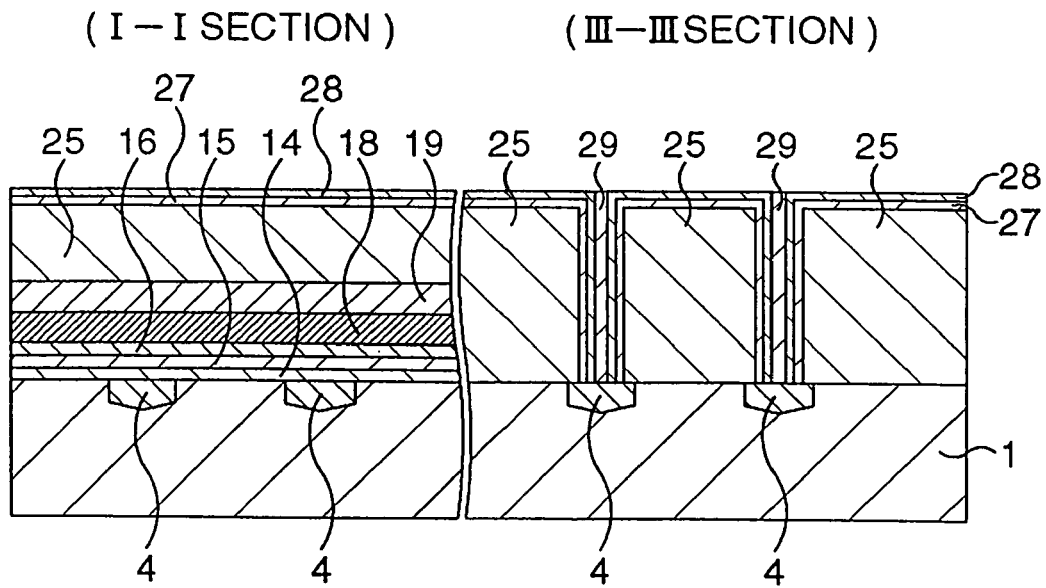

Next, a tungsten (W) film is deposited by the CVD process over the entire surface, and the tungsten film is planarized by the CMP process to thereby form tungsten plugs 29 as being buried in the contact holes 26 as shown in FIG. 6B.

Thereafter, unshown various wirings including aluminum wiring are formed, and an unshown protective insulating film is formed as an uppermost layer. This completes a SONOS-type memory cell array in the core area, and CMOS-type transistors in the peripheral circuit area. The bit-line, impurity-diffused layers 4 in the core area herein are connected to the wirings. On the other hand, the dummy contact holes 26a shown in FIG. 5A are not used for the wiring connection even in the process of forming various wirings.

After the above-described process steps, the semiconductor memory device of the present embodiment is completed.

While in the above-described embodiment, the hydrogen plasma treatment was carried out in succession to the formation of the titanium nitride film 28 by the CVD process, the present invention is by no means limited thereto, and any other process will be allowable provided that the silicon nitride film 15, which is a charge storage film, can be subjected to the hydrogen plasma treatment after the formation thereof. For example, the hydrogen plasma treatment can be effected at the time of the foregoing plasma pretreatment after the formation of the contact holes 26, or can be effected after the formation of the titanium film 27.

While the LOCOS process was employed in the element isolation in the above-described embodiment, it is achievable by the STI (shallow trench isolation) process. It is also allowable to form the gate electrode by the SALICIDE process using a cobalt film, although the gate electrode in the above embodiment was formed by stacking the tungsten silicide layer on the polysilicon layer. While the core area of the SONOS-structured semiconductor memory device employed the planar constitution in the above, it may also have a constitution based on so-called, bit-line oxidation system. The semiconductor substrate may be of n-type, and the crystal orientation thereof may be (100) or (111). The wiring connection to the bit lines may be established in any number of lines, such as one for every eight word lines, one for every thirty-two word lines, or one for every twenty word lines. While the memory cell array in the core area in the above embodiment was of virtual grounding type, any other structures including NOR type and NAND type are allowable.

The above embodiment is designed so that the silicon nitride film 15, which is a charge storage film, is subjected to the hydrogen plasma treatment after the formation thereof so as to remove electric charge stored therein, which therefore makes it possible to effectively erase unnecessary charge in the silicon nitride film 15 stored during the fabrication process of the semiconductor memory device. This successfully stabilizes the threshold voltage ($V_{th}$) of the semiconductor memory device. Carrying-out of the hydrogen plasma treatment within 90 seconds is beneficial in ensuring throughput in the fabrication.

The above process also employs the dummy contact holes 26a which have substantially no contribution to the wiring connection, in addition to the contact holes 26 through which the wiring connection is to be established. This successfully allows hydrogen radicals (H*) generated in the hydrogen plasma treatment or hydrogen molecules ($H_2$) in the atmosphere of the hydrogen annealing to diffuse into the semiconductor substrate not only through the contact holes 26 but also through the dummy contact holes 26a, which results in more effective erasure of the unnecessary charge stored in the silicon nitride film 15.

Characteristics Confirmation of Semiconductor Memory Device

Figure 7:
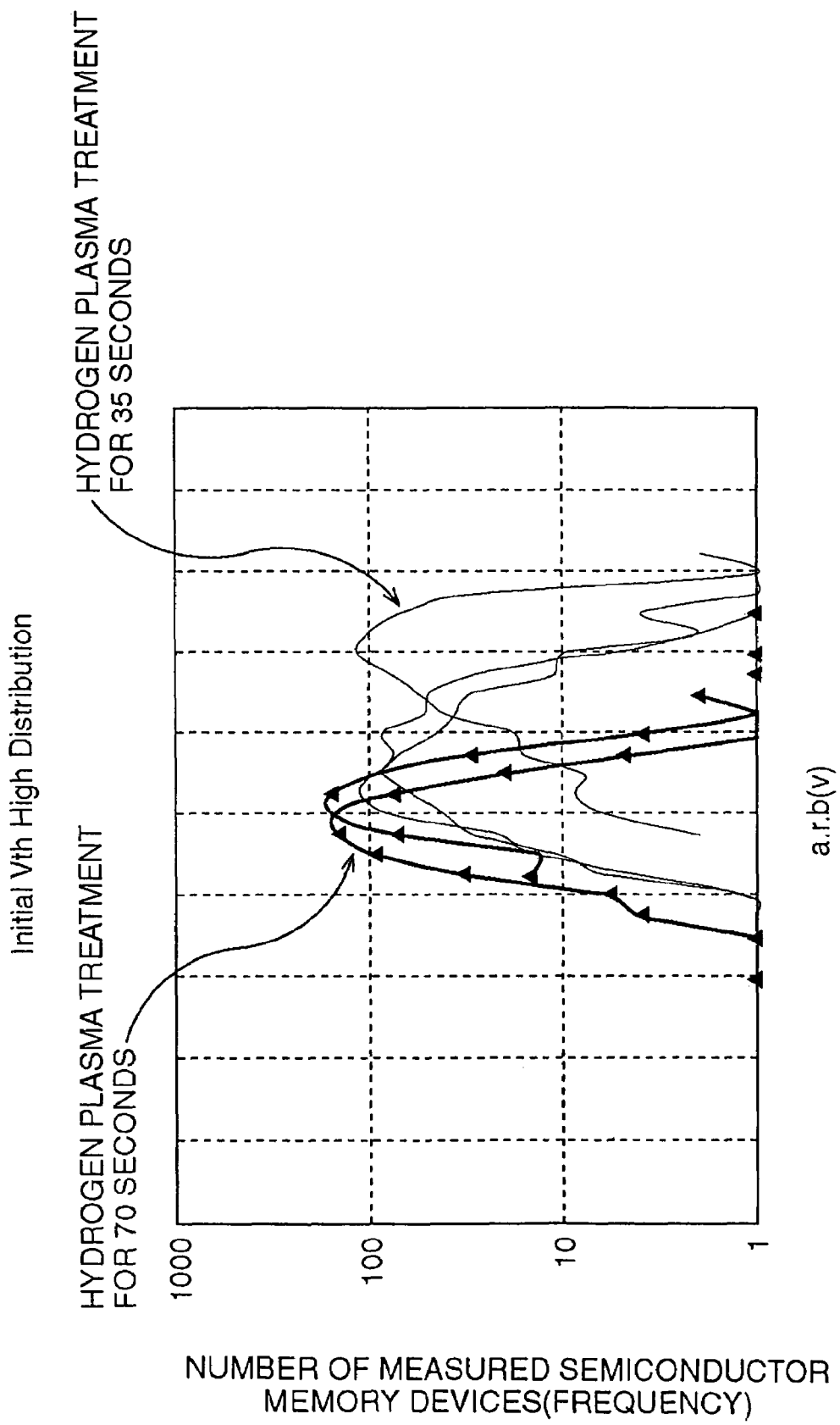
FIG. 7 is a schematic diagram of the threshold voltage ($V_{th}$) of the SONOS transistor.

FIG. 7 is a schematic diagram of initial characteristics of the threshold voltage ($V_{th}$) of the SONOS-type transistor according to the present embodiment.

Based on the definition in the above embodiment that the duration of time of the hydrogen plasma treatment after the formation of the charge storage film 15 should fall within a range from 40 to 90 seconds, this diagram exemplifies an experimental case in which the hydrogen plasma treatment was effected for 70 seconds, and a comparative case in which the hydrogen plasma treatment was effected only for 35 seconds.

In FIG. 7, the abscissa represents relative value of the threshold voltage (V) of the measured semiconductor memory devices, the ordinate represents the number of measured semiconductor memory devices (frequency), the thick lines represent characteristic curves of the semiconductor memory devices subjected to 70 seconds of the hydrogen plasma treatment, and thin lines represent those of the semiconductor memory devices subjected to 35 seconds of the treatment.

It is known from the diagram that the semiconductor memory devices subjected to 70 seconds of the hydrogen plasma treatment show lower threshold voltages with less variations therein. This is because the unnecessary negative charge stored in the charge storage film 15 was effectively erased by such 70 seconds of the hydrogen plasma treatment, which resulted in such lower threshold voltages with less variations.

On the other hand, the semiconductor memory devices subjected to only 35 seconds of the hydrogen plasma treatment show higher threshold voltages with larger variations therein. This is because the unnecessary negative charge stored in the charge storage film 15 was not sufficiently erased by such 35 seconds of the hydrogen plasma treatment, which resulted in such higher threshold voltages with larger variations.

The results shown in FIG. 7 proved that the hydrogen plasma treatment effected for a predetermined duration of time (40 seconds or longer) can provide a semiconductor memory device having a stabilized threshold voltage and an excellent reliability.

What is claimed is:

1. A semiconductor memory device being formed as a charge storage film for storing electric charge over a semiconductor substrate, said semiconductor memory device comprising:
    a first contact body used for wiring connection, and
    a second contact body not used for wiring connection but used for facilitating diffusion of hydrogen radicals or hydrogen molecules into said charge storage film;
    wherein the first contact body and the second contact body are formed to be connected separately from each other to a diffusion layer formed in the surface of the semiconductor substrate.

2. The semiconductor memory device according to claim 1, wherein said charge storage film is any one of
    a nitride film,
    a double-layered film comprising an oxide film and a nitride film, and
    a three-layered film comprising an oxide film, a nitride film and an oxide film.

* * * * *